(12) United States Patent
Yeh et al.

(10) Patent No.: US 8,257,992 B2
(45) Date of Patent: Sep. 4, 2012

(54) METHOD OF FABRICATING A PIXEL ARRAY

(75) Inventors: Yung-Hui Yeh, Hsinchu (TW); Chih-Ming Lai, Changhua County (TW); Chun-Cheng Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 27 days.

(21) Appl. No.: 13/050,956

(22) Filed: Mar. 18, 2011

(65) Prior Publication Data

US 2012/0171792 A1 Jul. 5, 2012

(30) Foreign Application Priority Data

Dec. 30, 2010 (TW) .............................. 99146762 A

(51) Int. Cl.
*H01L 21/00* (2006.01)
(52) U.S. Cl. .............................. 438/34; 438/85; 438/104
(58) Field of Classification Search .................... 438/34, 438/85, 104
See application file for complete search history.

(56) References Cited

U.S. PATENT DOCUMENTS

| | | | |
|---|---|---|---|
| 7,202,179 B2 | 4/2007 | Taussig et al. | |
| 7,248,306 B2 | 7/2007 | Perner et al. | |
| 7,341,893 B2 | 3/2008 | Mei et al. | |
| 7,521,313 B2 | 4/2009 | Mei | |
| 7,541,227 B2 | 6/2009 | Mei et al. | |
| 7,585,424 B2 | 9/2009 | Mei | |
| 7,768,008 B2 | 8/2010 | Ishizaki et al. | |
| 2006/0017875 A1 | 1/2006 | Perner et al. | |
| 2006/0134922 A1 | 6/2006 | Taussig et al. | |
| 2007/0040491 A1 | 2/2007 | Mei et al. | |
| 2007/0117278 A1 | 5/2007 | Perlov et al. | |
| 2008/0185591 A1 | 8/2008 | Mei et al. | |
| 2008/0248605 A1 | 10/2008 | Taussig et al. | |
| 2010/0006851 A1* | 1/2010 | Park ................................ 257/72 |
| 2010/0140619 A1 | 6/2010 | Bilyalov et al. | |
| 2010/0197074 A1* | 8/2010 | Song et al. ....................... 438/99 |
| 2012/0113346 A1* | 5/2012 | Choi et al. ...................... 349/43 |
| 2012/0120362 A1* | 5/2012 | Choi et al. .................... 349/140 |

FOREIGN PATENT DOCUMENTS

| | | |
|---|---|---|
| TW | 200901481 | 1/2009 |
| TW | 201005950 | 2/2010 |

OTHER PUBLICATIONS

Carl Taussig et al, "77.3: Invited Paper: Roll-to-Roll Manufacturing of Backplanes for Paper-Like Displays", SID Symposium Digest of Technical Papers, vol. 41, Issue 1, issued on May 2010—p. 1151-p. 1154.

(Continued)

*Primary Examiner* — Asok Sarkar
(74) *Attorney, Agent, or Firm* — Jianq Chyun IP Office

(57) ABSTRACT

A method of fabricating a pixel array is provided. A first metal layer is formed over a substrate. The metal layer is patterned to form a plurality of data lines and a plurality of drain patterns adjacent to each data line. The data lines and the drain patterns are separated from each other. An oxide semiconductor layer and a first insulation layer covering the oxide semiconductor layer are formed over the substrate. A second metal layer is formed on the first insulation layer and patterned to form a plurality of scan lines intersected with the data lines and the drain patterns. By using the scan lines as a mask, the oxide semiconductor layer and the first insulation layer are patterned to form a plurality of oxide semiconductor channels located under each scan line. Each oxide semiconductor channel is located between one data line and one drain pattern.

15 Claims, 15 Drawing Sheets

OTHER PUBLICATIONS

Yung-Hui Yeh et al, "P-37: Room Temperature Top-Gate Self-Aligned Amorphous InGaZnO TFTs Fabricated on Colorless Polyimide Substrate", SID Symposium Digest of Technical Papers, vol. 41, Issue 1, issued on May 2010, p. 1353-p. 1355.

Warren Jackson et al, "58.3: Fabrication of Zinc Tin Oxide TFTs by Self-Aligned Imprint Lithography (SAIL) on Flexible Substrates", SID Symposium Digest of Technical Papers, vol. 40, Issue 1, issued on Jun. 2009, p. 873-p. 876.

* cited by examiner

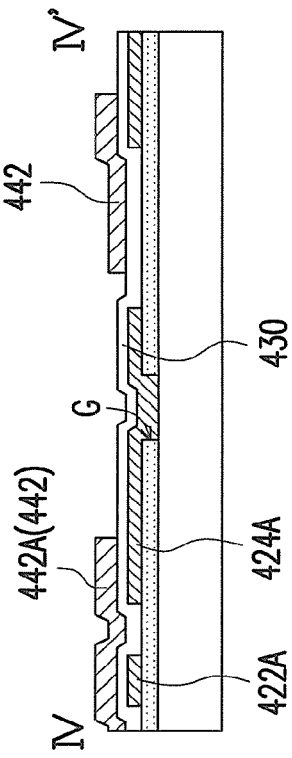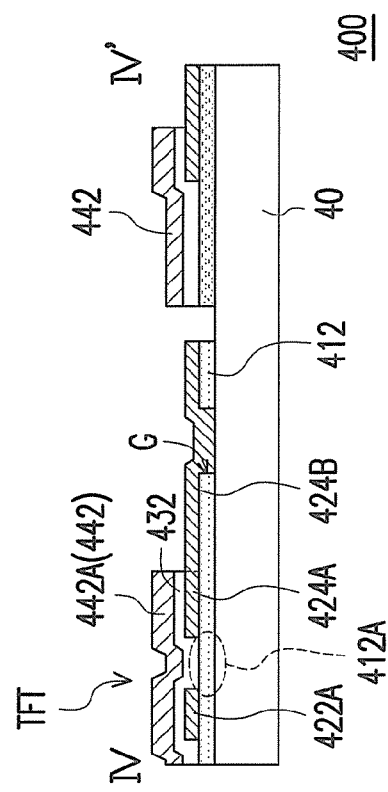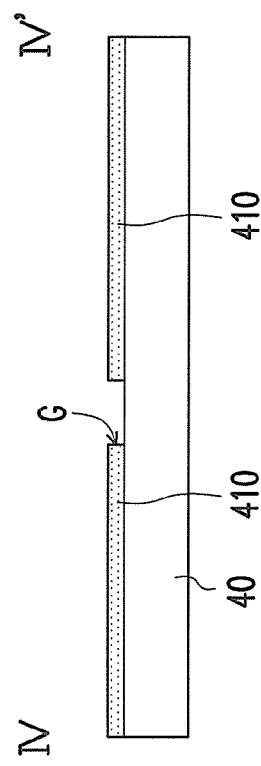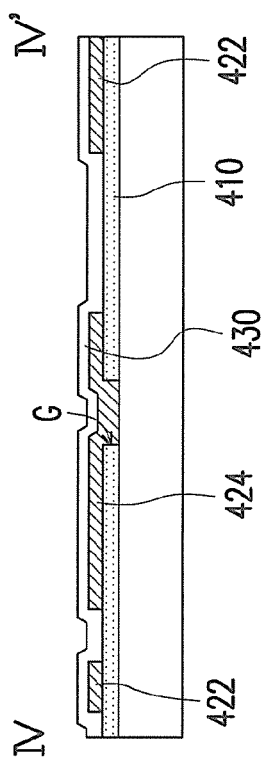
FIG. 10A
FIG. 10B
FIG. 10C
FIG. 10D

METHOD OF FABRICATING A PIXEL ARRAY

CROSS-REFERENCE TO RELATED APPLICATION

This application claims the priority benefit of Taiwan application serial no. 99146762, filed on Dec. 30, 2010. The entirety of the above-mentioned patent application is hereby incorporated by reference herein and made a part of this specification.

BACKGROUND OF THE APPLICATION

1. Field of the Application

The disclosure is related to a method of fabricating a pixel array.

2. Description of Related Art

With rapid development of image display technologies, cathode ray tube (CRT) displays that used to be applied in televisions or computers have been gradually replaced by flat panel displays (FPDs). Comparing to a rigid substrate, such as a glass substrate, a flexible substrate, such as a plastic substrate, has the characteristics of good flexibility and desirable impact endurance. Therefore, a flexible display equipped with the active devices, such as the thin film transistors, fabricated on a flexible substrate is recently provided.

Nevertheless, owing to the large coefficient of thermal expansion, the flexible substrate easily expands or shrinks with the temperature change of the environment during the fabrication of the flexible display. Therefore, the problems of low alignment accuracy and stringent temperature restriction during fabricating the thin film transistor on the flexible substrate need to be overcome.

Technologies of forming thin film transistor on the flexible substrate by using a roll-to-roll process have been provided in U.S. Pat. No. 7,202,179, U.S. Pat. No. 7,248,306, U.S. Pat. No. 7,341,839, U.S. Pat. No. 7,541,227, U.S. Pat. No. 7,521,313, U.S. Pat. No. 7,585,424, US Patent Publication No. 2006/0134922, US Patent Publication No. 2007/0040491, US Patent Publication No. 2007/0117278, US Patent Publication No. 2008/0185591, US Patent Publication No. 2008/0248605, U.S. Pat. No. 7,248,306, US Patent Publication No. 2006/0017875, and US Patent Publication No. 2008/0248605. Generally, the roll-to-roll process has the advantages of low cost for fabrication factor and facilitating the fabrication of the device with large area, which is suitable for being applied in the process for fabricating the thin film transistors.

SUMMARY OF THE APPLICATION

The disclosure provides a method of fabricating a pixel array having high alignment accuracy and increased yield rate.

An aspect of the disclosure directs to a method of fabricating a pixel array including forming a first metal layer over a substrate and patterning the first metal layer to form a plurality of data lines and a plurality of drain patterns adjacent to the data lines, wherein the data lines are separated from the drain patterns. An oxide semiconductor layer is formed over the substrate. A first insulation layer is formed over the substrate to cover the oxide semiconductor layer. A second metal layer is formed on the first insulation layer and the second metal layer is patterned to form a plurality of scan lines intersected with the data lines and the drain patterns. The oxide semiconductor layer and the first insulation layer are patterned by using the scan lines as a mask to form a plurality of oxide semiconductor channels under each of the scan lines, wherein each of the oxide semiconductor channels is located between one of the data lines and one of the drain patterns.

In light of the foregoing description, by modifying the process sequence, the scan lines are formed after the oxide semiconductor layer so that the gates and the channels in the pixel array can be self-aligned and the mis-alignment problem can be mitigated. On the other hand, the oxide semiconductor material is used for fabricating the channels of the thin film transistors according to the disclosure, and no additional doping process is performed for render the channels have the characteristic such as an ohmic contact. Accordingly, the high temperature process such as the doping process is not required in the method according to the disclosure.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

FIG. 10A to FIG. 10D are cross-sectional views along a line IV-IV' in FIG. 9A to FIG. 9D.

DESCRIPTION OF EMBODIMENTS

Figure 1A:
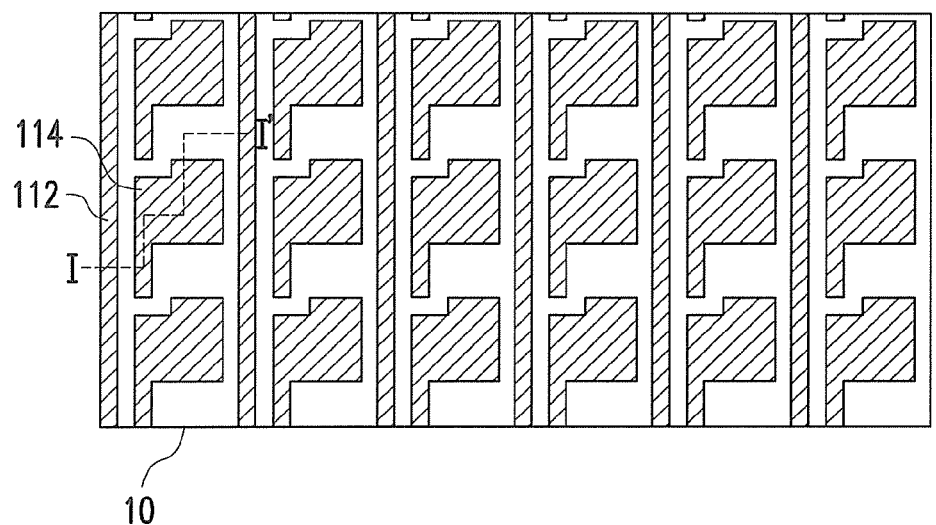
FIG. 1A through FIG. 1D are schematic top views depicting a method of fabricating a pixel array according to a first embodiment of the disclosure.

FIG. 1A through FIG. 1D are schematic top views depicting a method of fabricating a pixel array according to a first embodiment of the disclosure. FIG. 2A to FIG. 2D are cross-sectional views along a line I-I' in FIG. 1A to FIG. 1D. Referring to FIG. 1A and FIG. 2A together, a fabricating method according to the embodiment includes forming a first metal layer (not shown) on a substrate 10 and performing a first photolithographic and etching process to pattern the first metal layer (not shown) so that a plurality of data lines 112 and a plurality of drain patterns 114 adjacent to the data lines 112 are formed, wherein the data lines 112 are separated from the drain patterns 114.

In the embodiment, a material of the substrate 10 is, for example, a flexible material such as plastic material, metal, or stainless steel. Accordingly, the substrate 10 has flexible property and can be used in fabricating flexible products. A material of the first metal layer (not shown) can be selected from titanium (Ti), aluminum (Al), molybdenum (Mo), chromium (Cr), molybdenum-tungsten (Mo—W) alloy, indium tin oxide (ITO), or a combination of the above. A thickness of the first metal layer (not shown) is usually ranged about 100 nm to 400 nm. In one embodiment, the first metal layer (not shown) can be formed by a single material layer or a stack of multiple material layers. For instance, the data lines 112 and the drain patterns 114 can be formed by a stack of Ti/Al layers, a stack of Ti/Mo layers, a stack of Ti/Al/Ti layers, a stack of Ti/Al/Mo layers, a stack of Mo/Al/Mo layers, or a stack of Al/ITO layers. In addition, the process of forming the first metal layer (not shown) can be a roll-to-roll sputtering process.

Figure 1B:
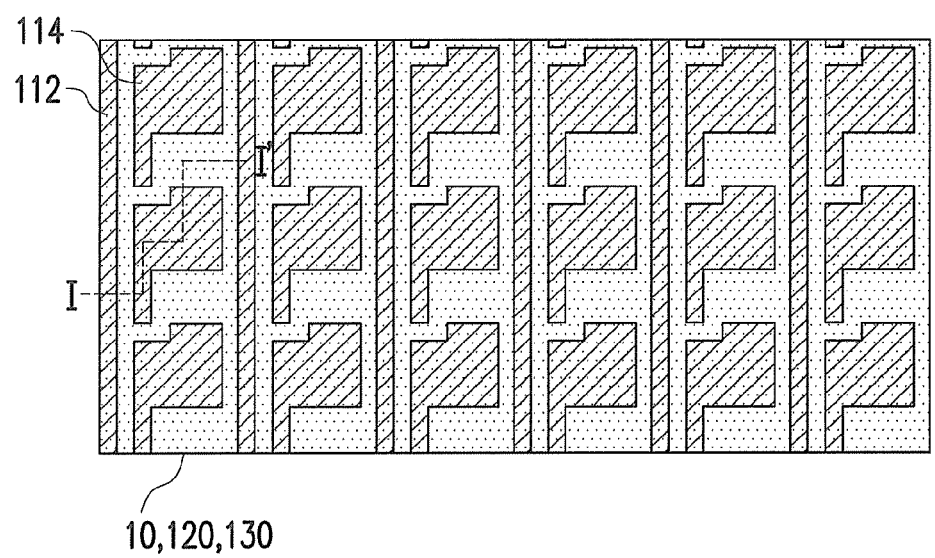
Figure 2C:
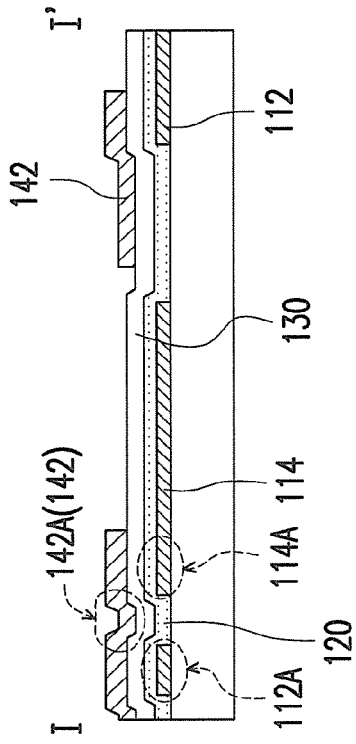
FIG. 2A to FIG. 2D are cross-sectional views along a line I-I' in FIG. 1A to FIG. 1D.
Figure 2D:
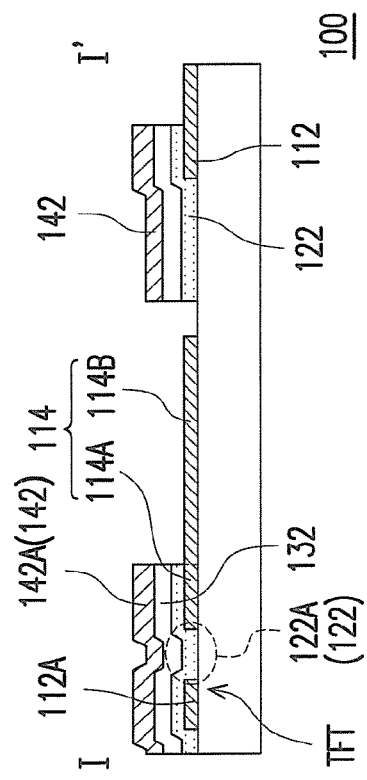
Figure 2A:
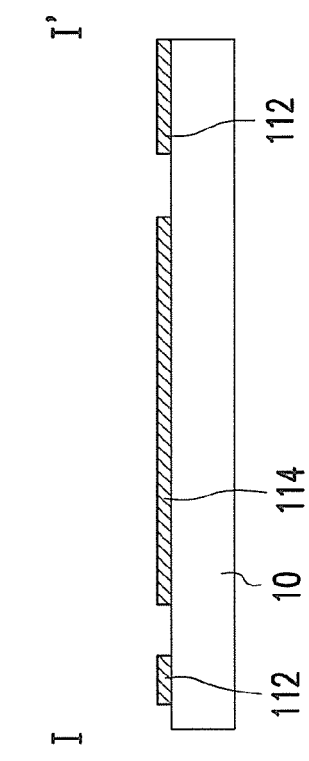
Figure 2B:
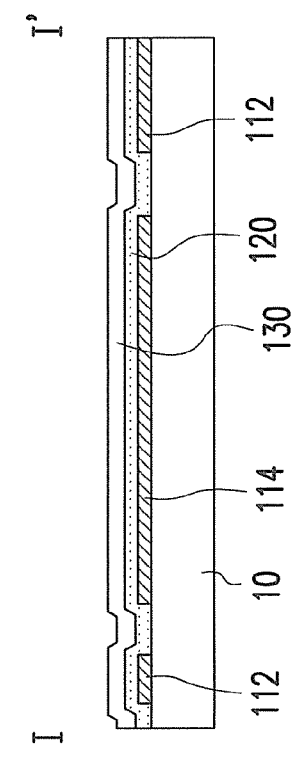

Next, referring to FIGS. 1B and 2B simultaneously, an oxide semiconductor layer 120 and a first insulation layer 130 is formed on the substrate 10. It is noted that the oxide semiconductor layer 120 and the first insulation layer 130 are completely formed on the substrate 10 so that the top view of FIG. 1B does not show the edges of the two layers. As shown in FIG. 2B, the oxide semiconductor layer 120 and the first insulation layer 130 are sequentially formed on the substrate 10 in the present embodiment. In the current process, the data line 112 and the drain patterns 114 are formed on the substrate 10 prior to the oxide semiconductor layer 120 is formed. The oxide semiconductor layer 120 and the first insulation layer 130 are not yet patterned and completely cover the data lines 112 and the drain patterns 114.

A material of the oxide semiconductor layer 120 includes zinc oxide (ZnO), indium gallium zinc oxide (IGZO), indium zinc tin oxide (IZTO), and the like. The oxide semiconductor layer 120 can be doped with a dopant selected from indium (In), aluminum (Al), gallium (Ga), tin (Sn), or a combination of the above. Therefore, the oxide semiconductor layer 120 can be a metal oxide semiconductor thin film doped with In, Al, Ga, Sn, or a combination thereof. A thickness of the oxide semiconductor layer 120 is usually ranged from 10 nm to 150 nm. A material of the first insulation layer 130 may include $Si_3N_4$, $SiO_2$, $Al_2O_3$, $Ta_2O_5$, $HfO_2$, or $TiO_2$. A thickness of the first insulation layer 130 is usually ranged from 100 nm to 500 nm. The substrate 10 in the present embodiment is a flexible substrate and thus a roll-to-roll sputtering process can be adopted in fabricating the oxide semiconductor layer 120 and the first insulation layer 130.

Figure 1C:
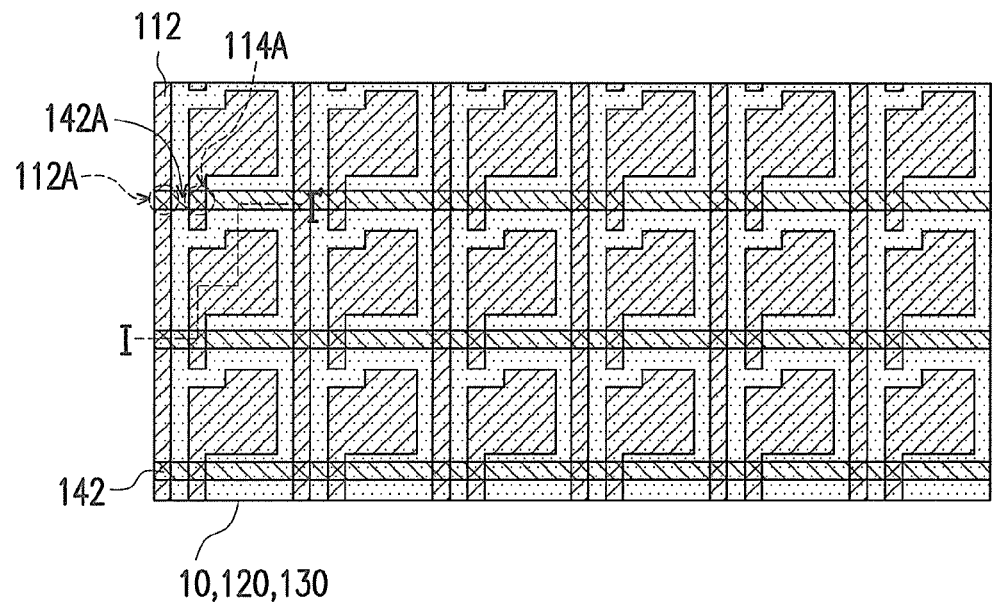

Thereafter, referring to FIG. 1C and FIG. 2C, a second metal layer (not shown) is formed on the first insulation layer 130 and a second photolithographic and etching process is performed to pattern the second metal layer (not shown) so as to form a plurality of scan lines 142. The scan lines 142 are intersected with the data lines 112. In the present embodiment, the extending direction of the scan lines 142 is parallel to that of the data lines 112, for example. Accordingly, the scan lines 142 are partially overlapped the data lines 112 and the drain patterns 114, wherein the portions of the data lines 112 and the drain patterns 114 overlapped with the scan lines 142 are defined as sources 112A and drains 114A, respectively. Portions of the scan lines 142 located between the sources 112A and the drains 114A are defined as the gates 142A.

A material of the second metal layer (not shown) can be selected from Ti, Al, Mo, Cr, Mo—W alloy, ITO, or a combination thereof and the second metal layer (not shown) can be formed by a single material layer or a stack of multiple material layers. Namely, the first metal layer and the second metal layer in the present embodiment can be made by similar material and formed by similar cross-sectional structure. In addition, the process of forming the second metal layer (not shown) can be a roll-to-roll sputtering process. A thickness of the second metal layer (not shown) is usually ranged about 100 nm to 400 nm.

Figure 1D:
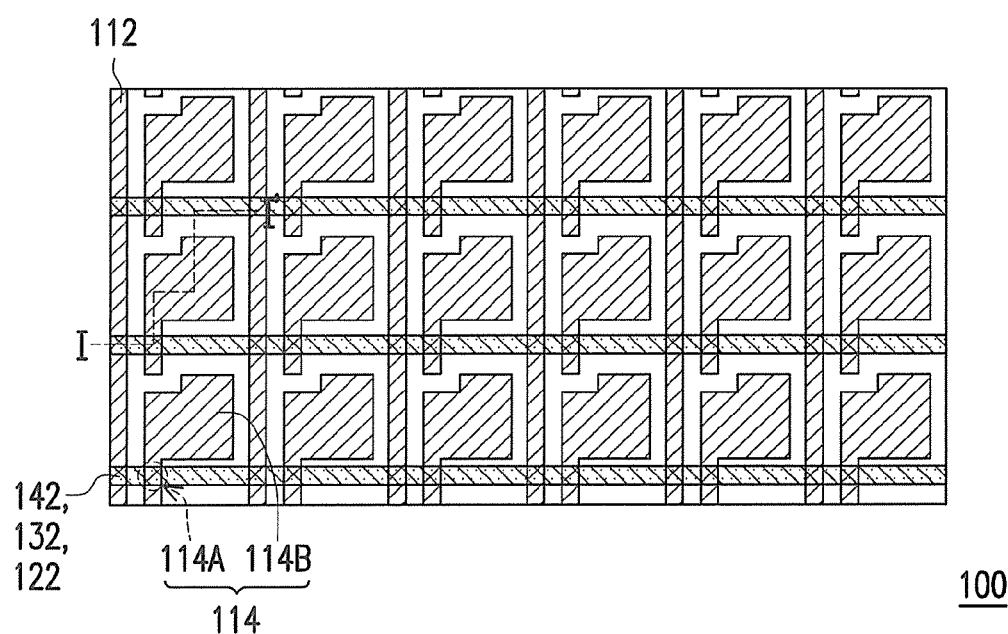

Then, referring to FIGS. 1D and 2D simultaneously, the first insulation layer 130 and the oxide semiconductor layer 120 are patterned by using the scan lines 142 as a mask. In the current process, the first insulation layer 130 and the oxide semiconductor layer 120 are respectively patterned into a first patterned insulation layer 132 and a patterned oxide semiconductor layer 122, wherein the patterned oxide semiconductor layer 122 includes a plurality of oxide semiconductor channels 122A. The components disposed on the substrate 10 thus constitute a pixel array 100.

The shapes of the first patterned insulation layer 132 and the patterned oxide semiconductor layer 122 are substantially identical to the shape of the scan lines 142 in the top view diagram, wherein the patterned oxide semiconductor layer 122 located under each of the scan lines 142 includes a plurality of the oxide semiconductor channels 112A. Each of the oxide semiconductor channels 122A is located between one of the sources 112A and one of the drains 114A and corresponding to one of the gates 142A. The gate 142A, the source 112A, the drain 114A, and the corresponding oxide semiconductor channel 122A together constitute a thin film transistor TFT. In the present embodiment, the gate 142A and the oxide semiconductor channel 122A can be self-aligned during the fabrication process so that mis-alignment is not liable to occur, which is conducive to improve the fabricating yield rate. The oxide semiconductor channels 122 located under each of the scan lines 142 are connected together in the present embodiment, but the disclosure is not limited thereto.

Figure 3A:
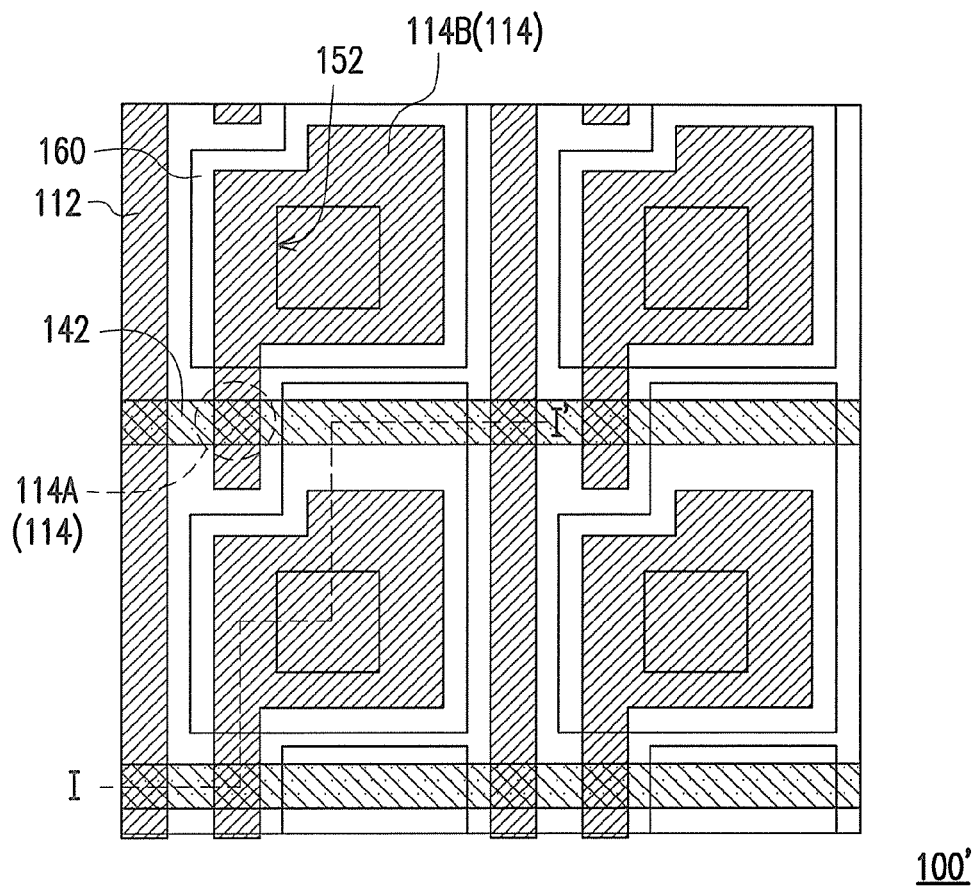
FIG. 3A schematically illustrates a pixel array according to a second embodiment of the disclosure.
Figure 3B:
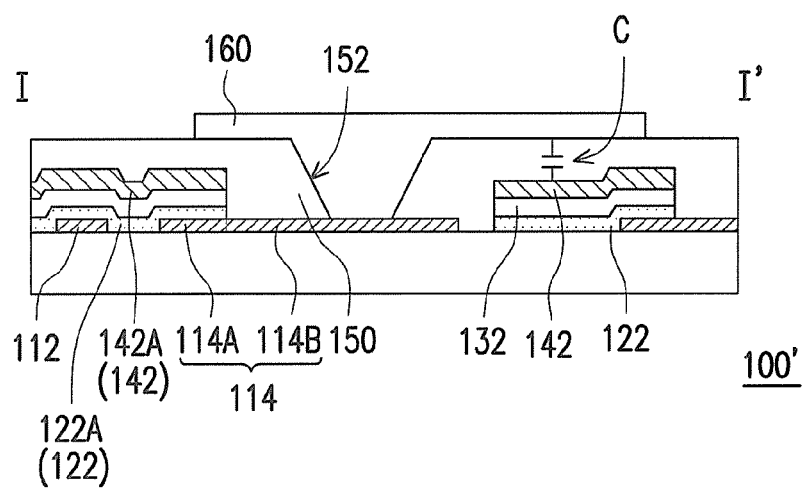
FIG. 3B is a cross-sectional view taken along a line I-I' depicted in FIG. 3A.

In addition, the drain pattern 114 substantially includes the drain 114A overlapped the scan line 142 and a body portion 114B according to the present embodiment. The body portion 114B is connected to the drain 114A and is not overlapped the scan line 142. The body portion 114B can be served as a pixel electrode to provide a function of light reflection when the pixel array 100 is applied in a reflective display panel. Nevertheless, the disclosure should not be construed as limited to the embodiment. FIG. 3A schematically illustrates a pixel array according to a second embodiment of the disclosure. FIG. 3B is a cross-sectional view taken along a line I-I' depicted in FIG. 3A. Referring to FIGS. 3A and 3B, the pixel array 100' further includes a second insulation layer 150 and a plurality of pixel electrodes 160 in addition to the components depicted in FIG. 1D and FIG. 2D.

The second insulation layer 150 in the present embodiment has a plurality of openings 152 and each of the openings 152 exposes one of the body portions 114B in the drain patterns 114. The pixel electrode 160 is disposed on the second insulation layer 150 and electrically connected to the body portion 114B of the corresponding drain pattern 114. In addition, the pixel electrode 160 is further overlapped one of the scan lines 142 to form the storage capacitor C. That is to say, another conductive layer rather than the drain pattern 114 can be served as the pixel electrode 160 in the present embodiment, wherein a material of said another conductor layer, i.e. the pixel electrode 160, can be transparent conductive material. A process for forming the second insulation layer 150 and the pixel electrodes 160 can be selected from a screen printing process, a spray printing process, or a roll-to-roll sputtering process. A thickness of the second insulation layer 150 is usually ranged from 100 nm to 500 nm.

In one embodiment, an organic light emitting layer and an anode can be selectively formed on each of the pixel electrodes 160 to construct an organic light emitting diode pixel array. It is noted that the substrate 10 disposed with the pixel array 100' can be applied in other display panels such as an electro-wetting display panel, a liquid crystal display panel, or an electrophoresis display panel. The application of the pixel array 100' should not be limited to the application in display. For example, photo sensor diodes can be fabricated on the pixel electrodes 160 to form a photo sensor array. A carbon paste conductive film having the characteristic that the resistance is varied with the external pressure can be fabricated on the pixel electrodes 160 to form an active pressure sensor array.

Figure 4A:
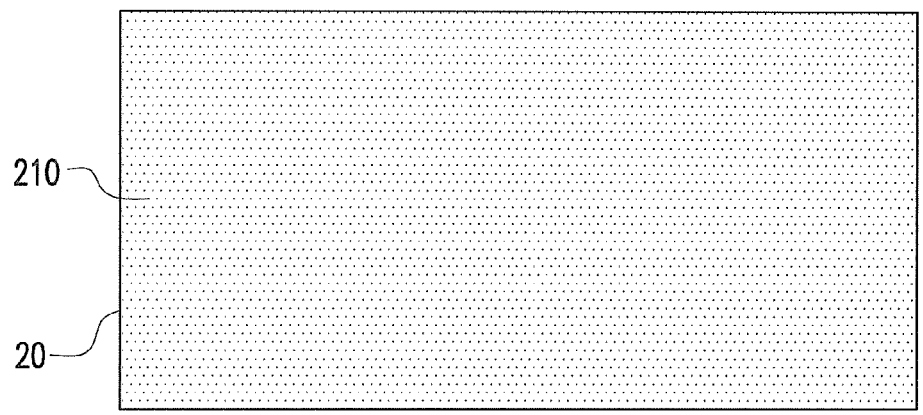
FIG. 4A through FIG. 4D are schematic top views depicting a method of fabricating a pixel array according to a third embodiment of the disclosure.

FIG. 4A through FIG. 4D are schematic top views depicting a method of fabricating a pixel array according to a third embodiment of the disclosure. FIG. 5A to FIG. 5D are cross-sectional views along a line II-II' in FIG. 4A to FIG. 4D. Referring to FIG. 4A and FIG. 5A, an oxide semiconductor layer 210 is formed on a substrate 20, wherein the oxide semiconductor layer 210 can be fabricated by the material and the process depicted in the first embodiment and the related descriptions are not repeated. Besides, the substrate 20 can be a flexible substrate such as a plastic substrate or a metal substrate.

Figure 4B:
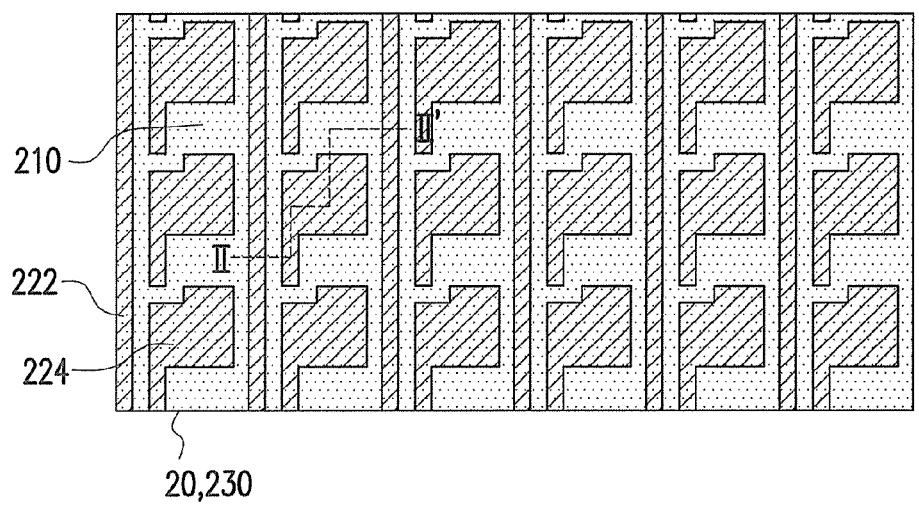
Figure 5A:
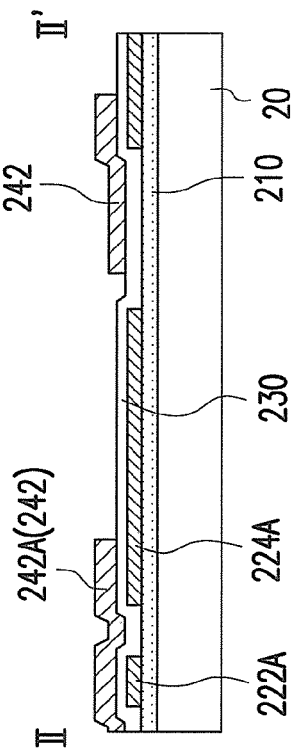
FIG. 5A to FIG. 5D are cross-sectional views along a line II-II' in FIG. 4A to FIG. 4D.
Figure 5B:
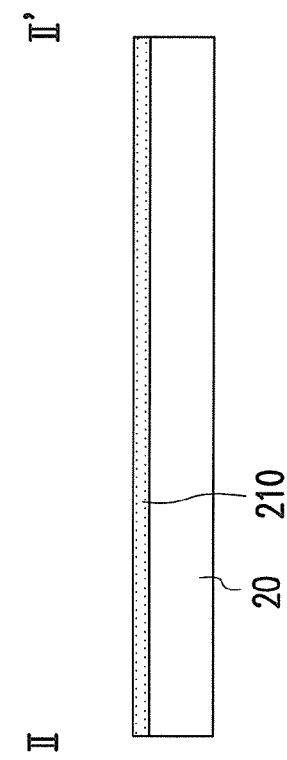

Thereafter, referring to FIG. 4B and FIG. 5B, a second metal layer (not shown) is formed on the oxide semiconductor layer 210 and a first photolithographic and etching process is performed to pattern the first metal layer (not shown) so as to form a plurality of data lines 222 and drain patterns 224. In the current process, the oxide semiconductor layer 210 is formed on the substrate 10 prior to the data lines 222 and the drain patterns 224 are formed. A portion of the oxide semiconductor layer 210 can be shielded by the data lines 222 and the drain patterns 224 and located under the data lines 222 and the drain patterns 224. After the fabrication of the data lines 222 and the drain patterns 224, a first insulation 230 is subsequently formed on the substrate 20.

Figure 4C:
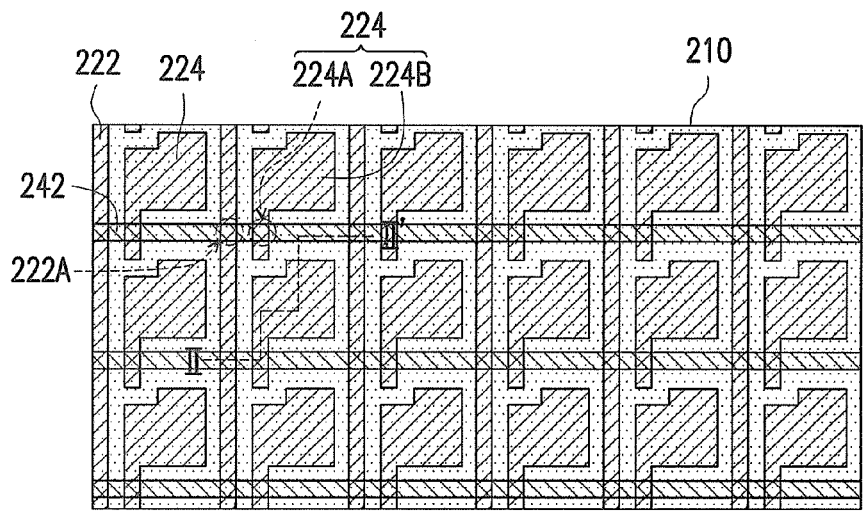
Figure 5C:
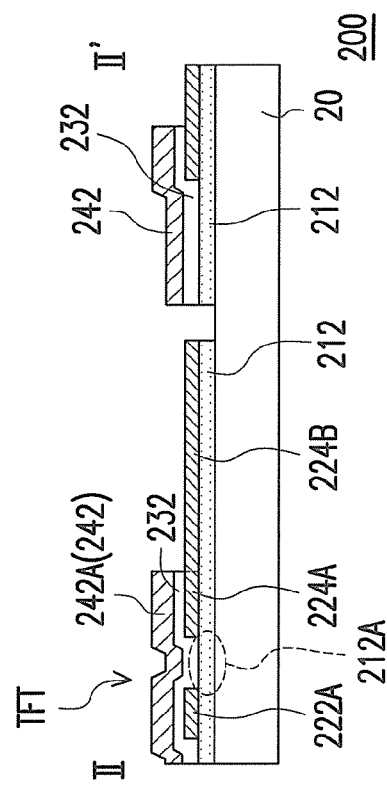

Then, referring to FIG. 4C and FIG. 5C, a second metal layer (not shown) is formed on the first insulation layer 230 and a second photolithographic and etching process is performed to pattern the second metal layer (not shown) so as to form a plurality of scan lines 242. Similar to the aforesaid embodiment, the scan lines 242 are intersected with the data lines 222 and the drain patterns 224 so that sources 222A and drains 224A are defined in the data lines 222 and the drain patterns 224 and portions of the scan lines 242 located between the sources 222A and the drains 224A are defined as the gates 242A. In the present embodiment, in addition to the drain 224A overlapped the scan line 242, each of the drain patterns 224 further includes a body portion 224B connected to the drain 224A, wherein the body portion 224B is not overlapped with the scan line 242.

Figure 4D:
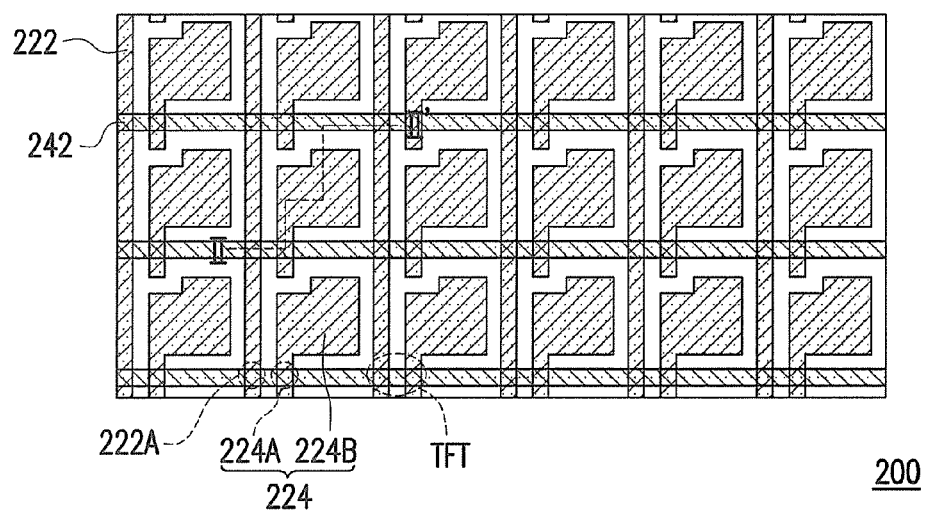
Figure 5D:
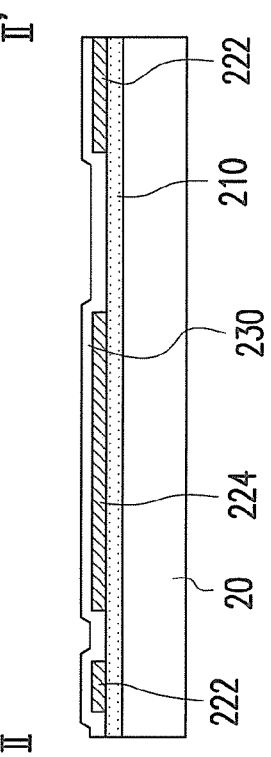

Referring to FIGS. 4D and 5D simultaneously, the first insulation layer 230 and a portion of the oxide semiconductor layer 210 not shielded by the data lines 222 and the drain patterns 224 are patterned by using the scan lines 242 as a mask so as to form a first patterned insulation layer 232 and a patterned oxide semiconductor layer 212. The patterned oxide semiconductor layer 212 includes a plurality of oxide semiconductor channels 212A and each of the oxide semiconductor channels 212A is located between one of the sources 222A and one of the drains 224A. Herein, the gate 242A, the source 222A, the drain 224A, and the corresponding oxide semiconductor channel 212A together constitute a thin film transistor TFT. The body portion 224B of the drain pattern 224 is connected to the thin film transistor TFT to be served as a pixel electrode. The components disposed on the substrate 20 thus constitute a pixel array 200.

Figure 6A:
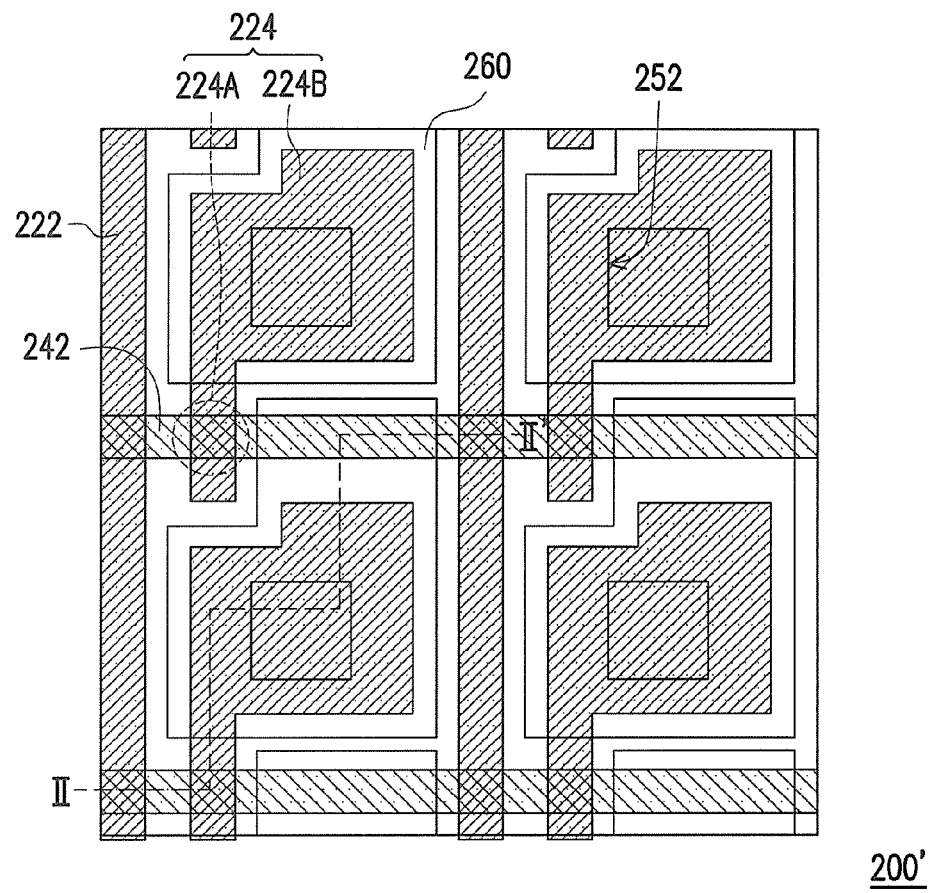
FIG. 6A schematically illustrates a pixel array according to a fourth embodiment of the disclosure.
Figure 6B:
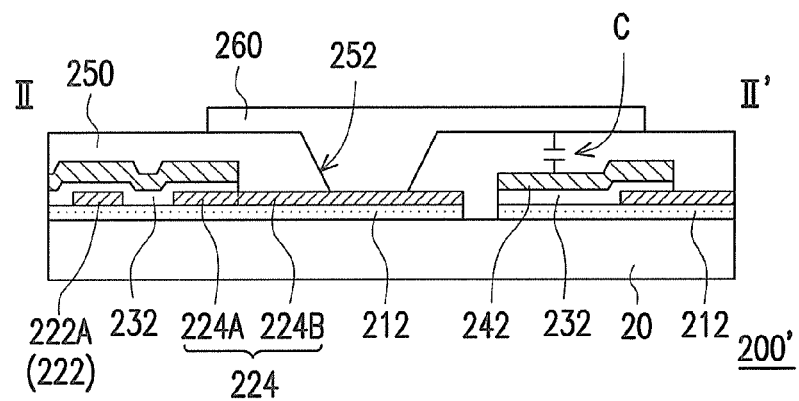
FIG. 6B is a cross-sectional view taken along a line II-II' depicted in FIG. 6A.

FIG. 6A schematically illustrates a pixel array according to a fourth embodiment of the disclosure. FIG. 6B is a cross-sectional view taken along a line II-II' depicted in FIG. 6A. Referring to FIGS. 6A and 6B, the pixel array 200' further includes a second insulation layer 250 and a plurality of pixel electrodes 260 in addition to the components depicted in FIG. 4D and FIG. 5D.

The second insulation layer 250 in the present embodiment has a plurality of openings 252 and each of the openings 252 exposes the body portion 224B of the drain pattern 224. The pixel electrode 260 is disposed on the second insulation layer 250 and electrically connected to the body portion 224B of the drain pattern 224 through the corresponding opening 252. In addition, the pixel electrode 260 is further overlapped with one of the scan lines 242 to form the storage capacitor C. That is to say, another conductive layer disposed on the body portion 224B of the drain pattern 224 can be served as the pixel electrode 260 in the present embodiment, wherein a material of said another conductor layer, i.e. the pixel electrode 260, can be transparent conductive material. In one embodiment, an organic light emitting layer and an anode can be selectively formed on each of the pixel electrodes 260 so that the substrate 20 having the pixel array 200' can be an organic light emitting diode pixel array substrate. It is noted that the substrate 20 disposed with the pixel array 200' can be applied in other display panels such as an electro-wetting display panel, a liquid crystal display panel, or an electrophoresis display panel. The application of the pixel array 200' should not be limited to the application in the displays. For example, photo sensor diodes can be fabricated on the pixel electrodes 260 to form a photo sensor array. A carbon paste conductive film having the characteristic that the resistance is varied with the external pressure can be fabricated on the pixel electrodes 260 to form the active pressure sensor array.

FIG. 7A through FIG. 7D are schematic top views depicting a method of fabricating a pixel array according to a fifth embodiment of the disclosure. FIG. 8A to FIG. 8D are cross-sectional views along a line III-III' in FIG. 7A to FIG. 7D. Referring to both FIG. 7A and FIG. 8A, the method of the present embodiment is similar to that of the first embodiment. First, a plurality of data lines 312 and a plurality of drain patterns 314 are formed on a substrate 30. Next, referring to FIGS. 7B and 8B simultaneously, an oxide semiconductor layer 320 and a first insulation layer 330 are sequentially formed on the substrate 30, wherein the oxide semiconductor layer 320 has a plurality of gaps G. The gaps G separate the oxide semiconductor layer 320 into a plurality of bar patterns independent from each other. The pitch of the gaps G is, for example, identical to the pitch of the data lines 312 and the extension direction of the gap G is parallel to the extension direction of the data line 312. It is noted that a smallest width of the gap G is determined on the etching capability during fabricating the oxide semiconductor layer 320 and generally is 4 μm.

Figure 7A:
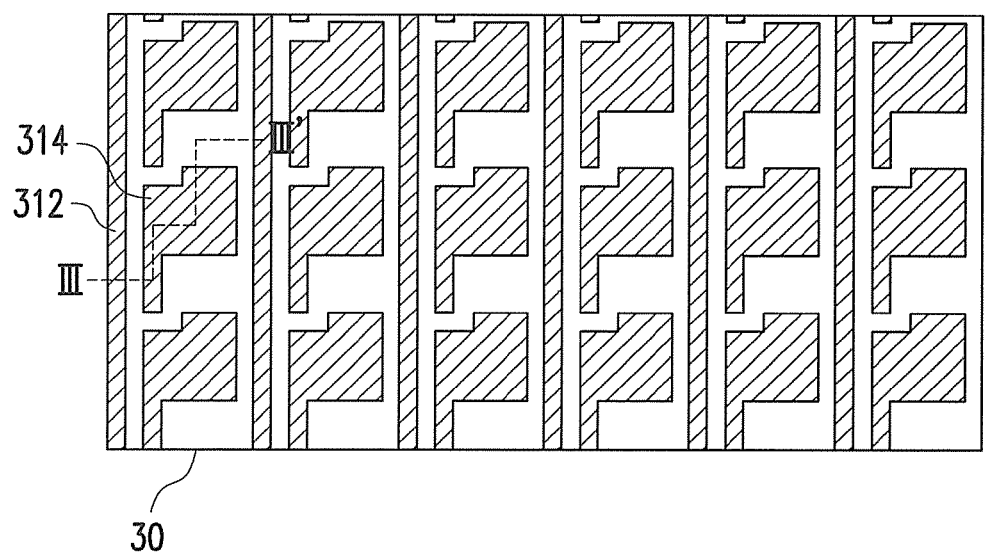
FIG. 7A through FIG. 7D are schematic top views depicting a method of fabricating a pixel array according to a fifth embodiment of the disclosure.
Figure 7B:
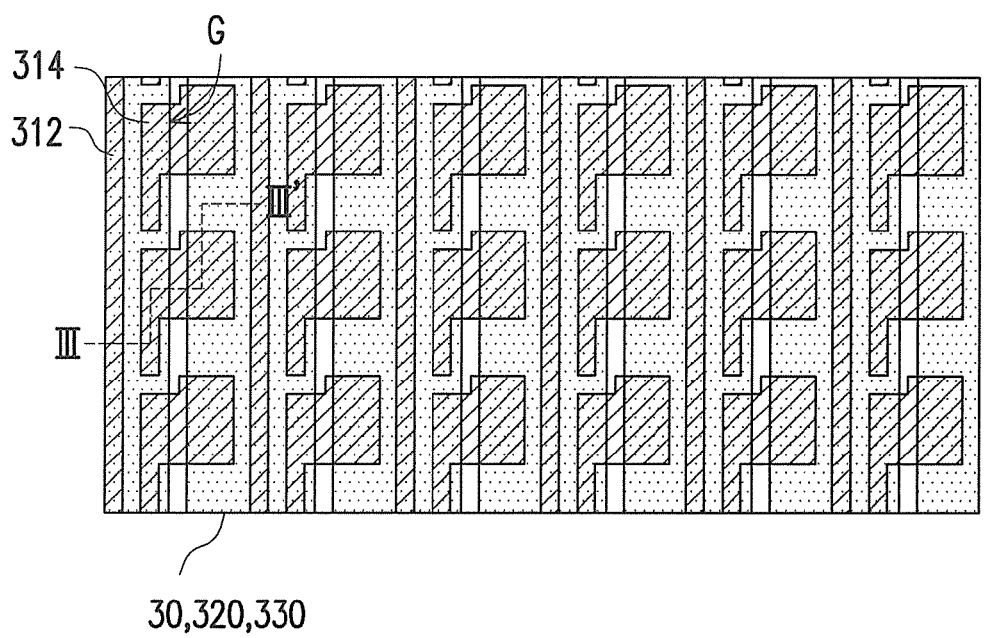
Figure 7C:
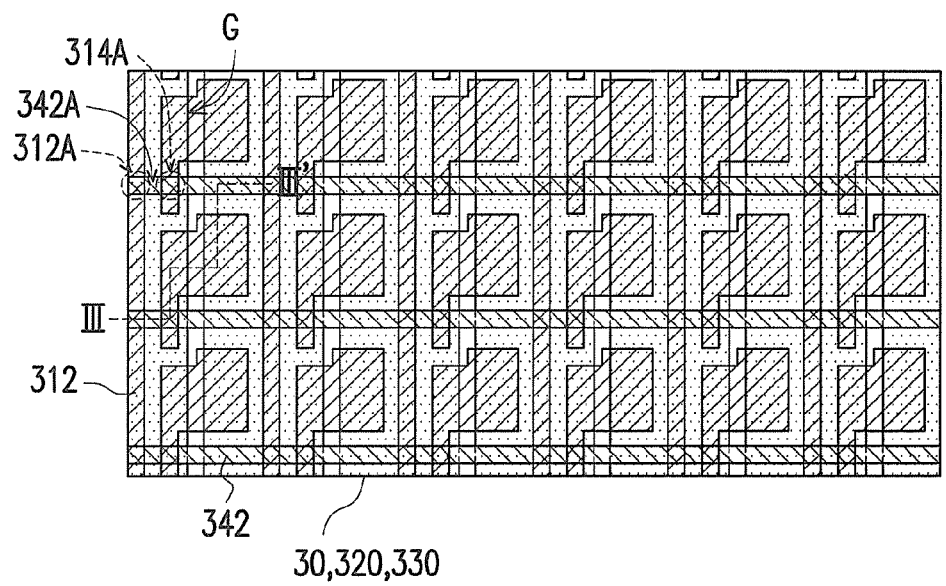
Figure 8A:
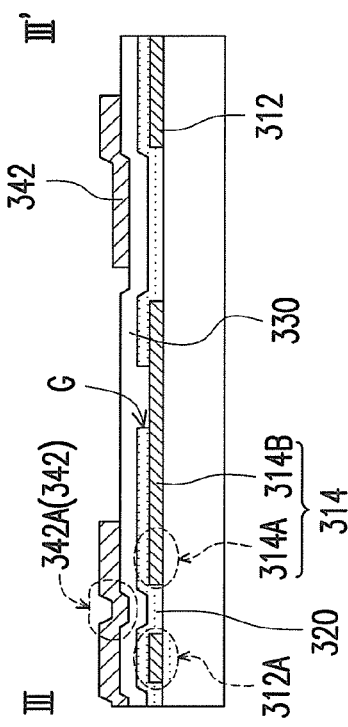
FIG. 8A to FIG. 8D are cross-sectional views along a line III-III' in FIG. 7A to FIG. 7D.
Figure 8B:
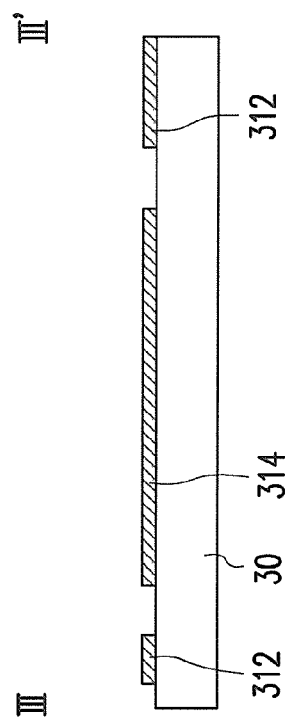
Figure 8C:
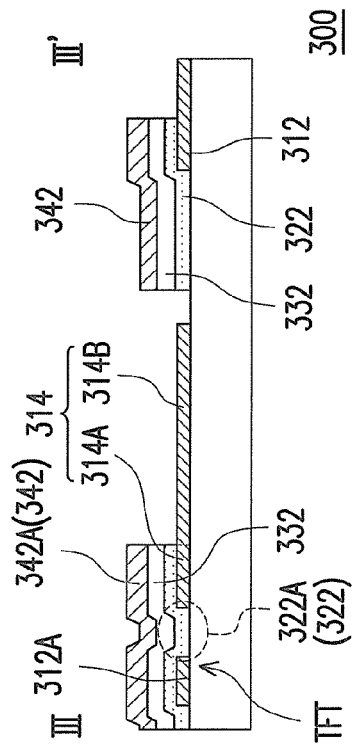

Then, referring to FIG. 7C and FIG. 8C, a plurality of scan lines 342 is formed on the first insulation layer 330. The scan lines 342 are intersected with the data lines 312 and the drain patterns 314 so that gates 342A, sources 312A, and drains 314A are respectively defined in the scan lines 342, the data lines 312, and the drain patterns 314. In addition to the drain 314A, the drain pattern 314 further includes a body portion 314B not overlapping the scan lines 342. The gaps G of the oxide semiconductor layer 320 are located above the body portions 314B, for example.

Figure 7D:
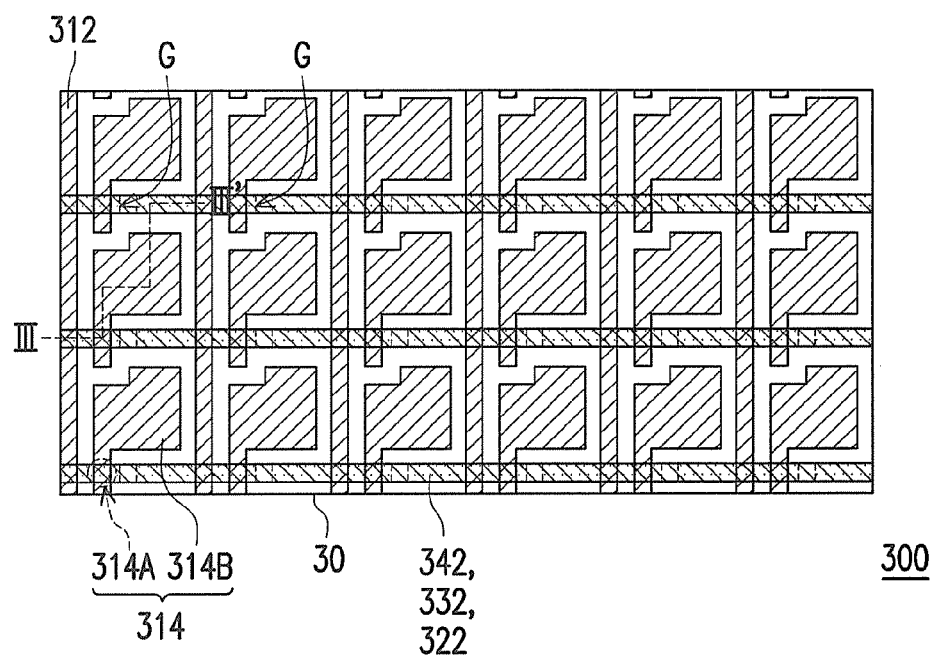
Figure 8D:
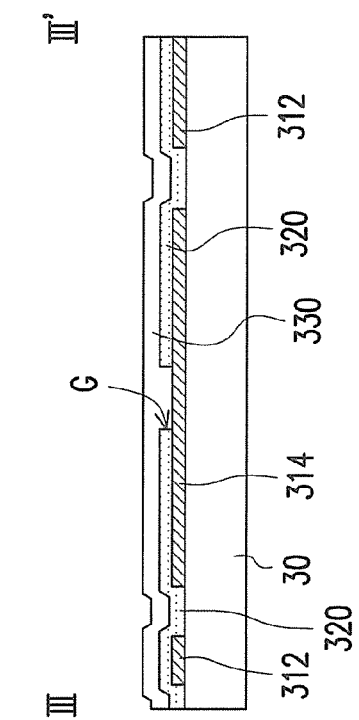

Referring to FIGS. 7D and 8D simultaneously, the first insulation layer 330 and the oxide semiconductor layer 320 are patterned by using the scan lines 342 as a mask so as to form a first patterned insulation layer 332 and a patterned oxide semiconductor layer 322. The components disposed on the substrate 30 thus constitute a pixel array 300.

The shapes of the first patterned insulation layer 332 and the patterned oxide semiconductor layer 322 are substantially similar to the shapes of the scan lines 342, wherein the patterned oxide semiconductor layer 322 located under each of the scan lines 342 includes a plurality of the oxide semiconductor channels 322A. Each of the oxide semiconductor channels 322A is located between one of the sources 312A and one of the drains 314A and corresponding to one of the gates 342A. The gate 342A, the source 312A, the drain 314A, and the corresponding oxide semiconductor channel 322A together constitute a thin film transistor TFT. In the present embodiment, the gate 342A and the oxide semiconductor channel 322A can be self-aligned during the fabrication process so that mis-alignment is not liable to occur, which is conducive to improve the fabricating yield rate. The oxide semiconductor channels 322A located under each of the scan lines 342 are separated by the gaps G. Accordingly, the thin film transistors TFT have independent characteristic, respectively.

FIG. 9A through FIG. 9D are schematic top views depicting a method of fabricating a pixel array according to a sixth embodiment of the disclosure. FIG. 10A to FIG. 10D are cross-sectional views along a line IV-IV' in FIG. 9A to FIG. 9D. Referring to both FIG. 9A and FIG. 10A, the method of the present embodiment is similar to that of the third embodiment. An oxide semiconductor layer 410 is firstly fabricated on the substrate 40, wherein the oxide semiconductor layer 410 has a plurality of gaps G. The gaps G separate the oxide semiconductor layer 410 into a plurality of bar patterns independent from each other. Then, referring to FIG. 9B and FIG. 10B, a plurality of scan lines 422, a plurality of drain patterns 424, and a first insulation layer 430 are formed on the substrate 40. The pitch of the gaps G is, for example, identical to the pitch of the data lines 422 and the extension direction of the gap G is parallel to the extension direction of the data line 422.

Figure 9A:
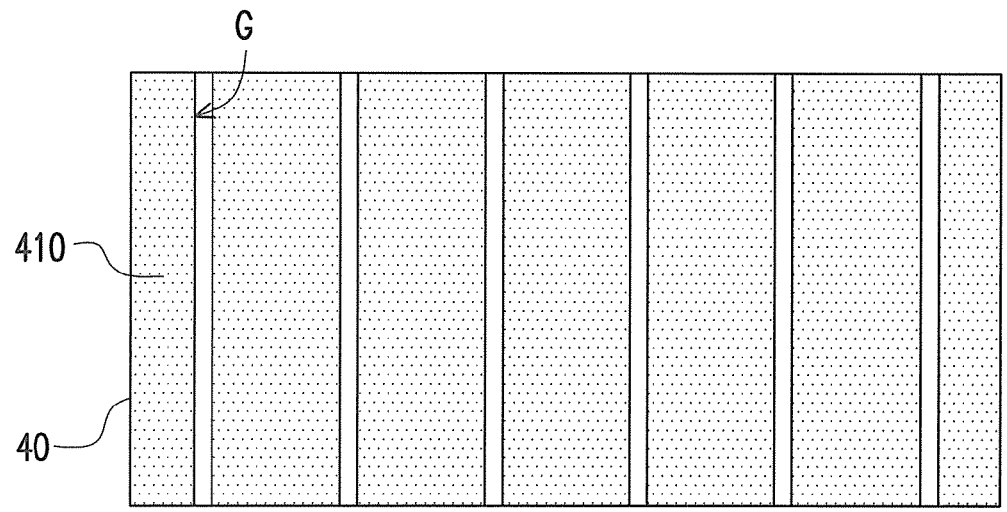
FIG. 9A through FIG. 9D are schematic top views depicting a method of fabricating a pixel array according to a sixth embodiment of the disclosure.
Figure 9B:
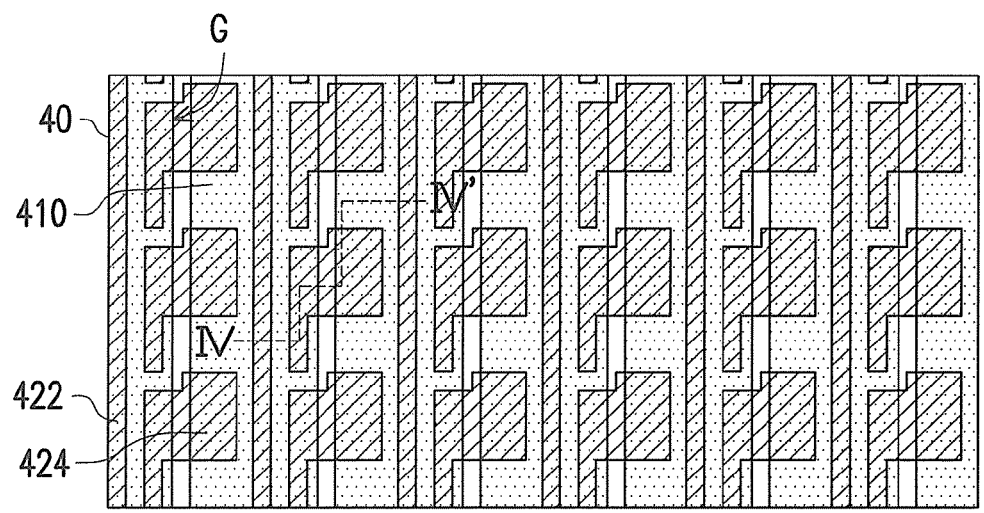
Figure 9C:
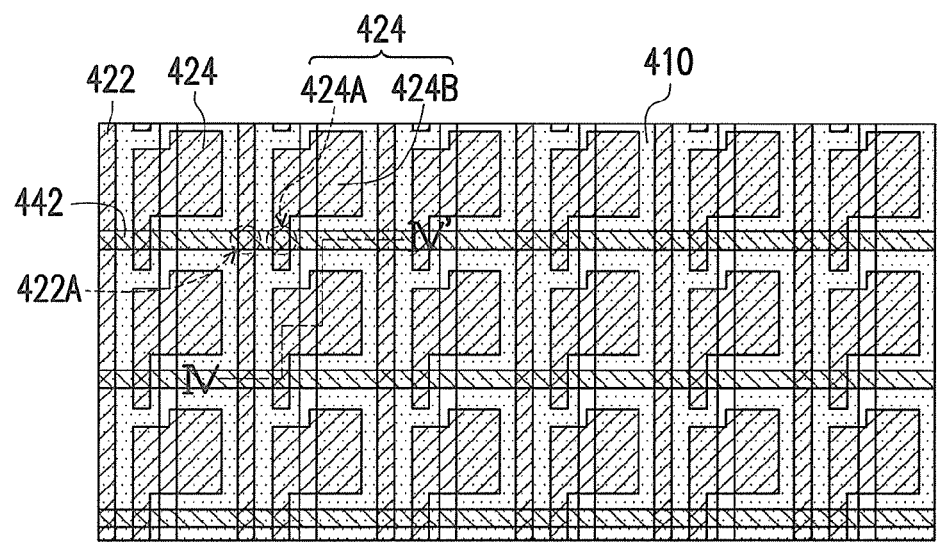

Then, referring to FIG. 9C and FIG. 10C, a plurality of scan lines 442 is formed on the first insulation layer 430. The scan lines 442 are intersected with the data lines 422 and the drain patterns 424 so that gates 442A, sources 422A, and drains 424A are respectively defined in the scan lines 442, the data lines 422, and the drain patterns 424. In addition to the drain 424A, the drain pattern 424 further includes a body portion 424B not overlapping the scan lines 442. The gaps G of the oxide semiconductor layer 410 are located under the body portions 424B, for example.

Figure 9D:
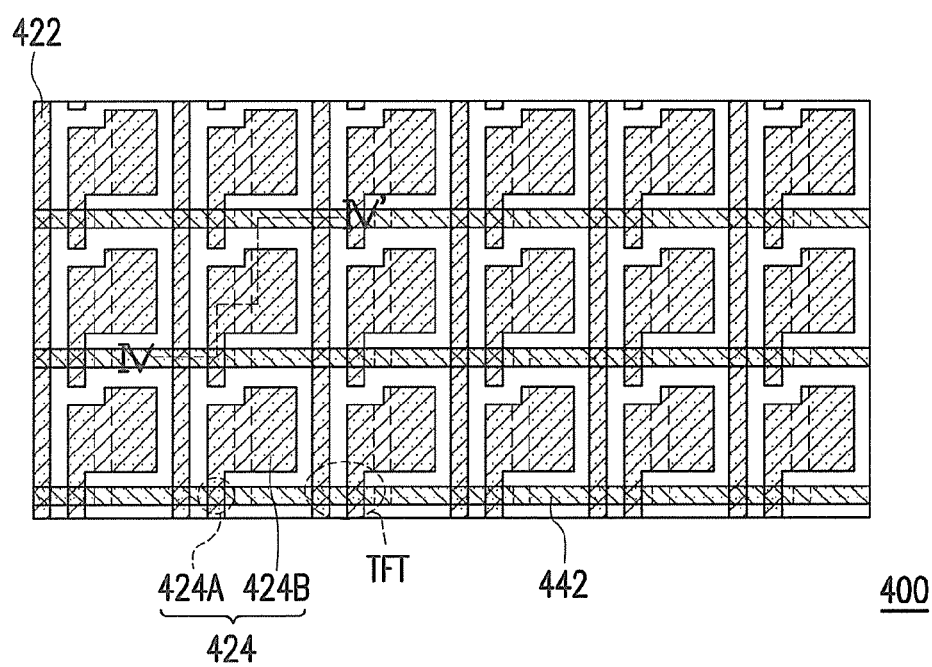

Referring to FIGS. 9D and 10D simultaneously, the first insulation layer 430 and a portion of the oxide semiconductor layer 410 not shielded by the data lines 422 are patterned by using the scan lines 442 as a mask so as to form a first patterned insulation layer 432 and a patterned oxide semiconductor layer 412. The components disposed on the substrate 40 thus constitute a pixel array 400.

The shapes of the first patterned insulation layer 432 and the patterned oxide semiconductor layer 412 are substantially similar to the shapes of the scan lines 442, wherein the patterned oxide semiconductor layer 412 located under each of the scan lines 442 includes a plurality of oxide semiconductor channels 412A. Each of the oxide semiconductor channels 412A is located between one of the sources 422A and one of the drains 424A and is corresponding to one of the gates 442A. The gate 442A, the source 422A, the drain 424A, and the corresponding oxide semiconductor channel 412A together constitute a thin film transistor TFT. In the present embodiment, the gate 442A and the oxide semiconductor channel 412A can be self-aligned during the fabrication process so that mis-alignment is not liable to occur, which is conducive to improve the fabricating yield rate. The oxide semiconductor channels 412A located under each of the scan lines 442 are separated by the gaps G. Accordingly, the thin film transistors TFT have independent characteristic, respectively.

Figure 11:
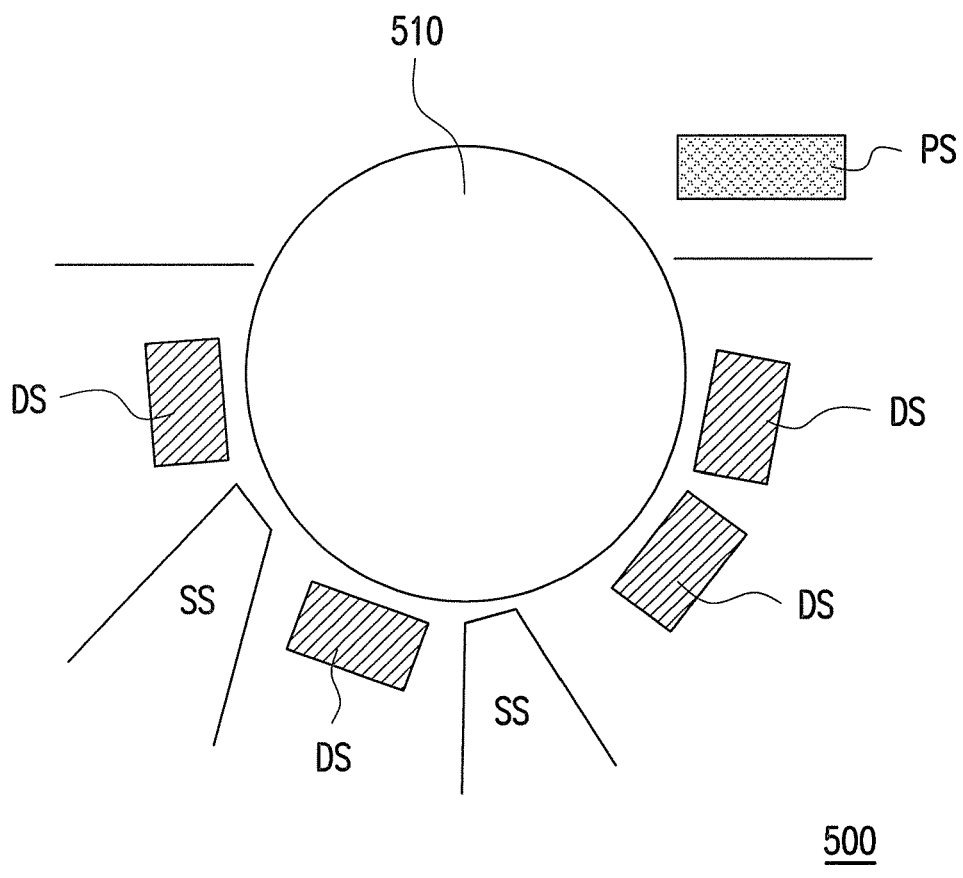
FIG. 11 is a schematic diagram illustrating a roll-to-roll sputtering machine.

It is noted that the film layers depicted in the above embodiments can be fabricated by using a roll-to-roll sputtering process and part of the film layers can be fabricated sequentially by using the roll-to-roll sputtering process. FIG. 11 schematically illustrates a roll-to-roll machine adopted in the fabrication method of the application. Referring to FIG. 11, a roll-to-roll machine 500 includes a drum 510, a plurality of deposition sections DS, a plurality of separation sections SS, and a pre-treatment section PS. The pre-treatment section PS is configured beside the roll-to-roll machine 500 and the deposition section DS and the separation section SS alternately arranged surround the drum 510. A flexible substrate (not shown) is rolled along the drum 510 and various layers are formed on the flexible substrate in different deposition sections DS during performing the roll-to-roll sputtering process. A power of the sputtering emitter configured in the deposition sections DS can be a radio frequency (RF) emitter, a magnetron sputtering (MS) emitter, a direct current (DC) emitter, an pulse DC emitter, or the like. A pressure in the deposition section DC is between 1 Pa to $10^{-4}$ Pa, the gas inserted into the deposition section DS can be Ar, $O_2$, $N_2$, and the like, and the flux of the gas is from 0 sccm to 200 sccm during the sputtering process. A rotating speed of the drum 510 during the sputtering process is from 0.1 m/min to 10 m/min. The temperature of the drum 510 can be set at −15° C. to 80° C. during the sputtering process, and room temperature is commonly adopted.

In view of the above, the present disclosure is not limited to the aforesaid process sequence. No matter whether process sequence is adopted, the scan lines are used as a mask for patterning the oxide semiconductor layer so as to facilitate the self-alignment between the gate and the corresponding oxide semiconductor channel. The problem of mis-alignment does not easily occur in the method of fabricating the pixel array according to the disclosure so that the method has desirable fabricating yield rate during fabricating a flexible product. On the other hand, the oxide semiconductor material is used for fabricating the channels of the thin film transistors according to the disclosure, and no additional doping process is performed for render the channels have the characteristic such as an ohmic contact. Accordingly, the high temperature process such as the doping process is not required in the method according to the disclosure.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of fabricating a pixel array, comprising:
forming a first metal layer over a substrate and patterning the first metal layer to form a plurality of data lines and a plurality of drain patterns adjacent to the data lines, wherein the data lines are separated from the drain patterns;
forming an oxide semiconductor layer over the substrate;
forming a first insulation layer over the substrate to cover the oxide semiconductor layer;
forming a second metal layer on the first insulation layer and patterning the second metal layer to form a plurality of scan lines intersected with the data lines and the drain patterns; and
patterning the oxide semiconductor layer and the first insulation layer by using the scan lines as a mask to faun a plurality of oxide semiconductor channels under each of the scan lines, wherein each of the oxide semiconductor channels is located between one of the data lines and one of the drain patterns respectively.

2. The method of fabricating the pixel array as claimed in claim 1, wherein the process of forming at least one of the first metal layer, the oxide semiconductor layer, the first insulation layer, and the second metal layer comprises a roll-to-roll sputtering process.

3. The method of fabricating the pixel array as claimed in claim 1, further comprises forming a plurality of gaps in the oxide semiconductor layer, wherein the gaps are substantially parallel to the data lines, the gaps are respectively located between two adjacent data lines, and the gaps separate the oxide semiconductor channels under each of the scan lines.

4. The method of fabricating the pixel array as claimed in claim 1, wherein the data lines and the drain patterns are formed on the substrate prior to the oxide semiconductor layer is formed.

5. The method of fabricating the pixel array as claimed in claim 1, wherein the oxide semiconductor layer is formed on the substrate prior to the data lines and the drain patterns are formed.

6. The method of fabricating the pixel array as claimed in claim 1, further comprising forming a second insulation layer on the substrate to cover the scan lines, the data lines, and the drain patterns.

7. The method of fabricating the pixel array as claimed in claim 6, wherein a process of forming the second insulation layer comprises a screen printing process, a spray printing process, or a roll-to-roll sputtering process.

8. The method of fabricating the pixel array as claimed in claim 6, further comprising forming a plurality of openings in the second insulation layer to expose the drain patterns.

9. The method of fabricating the pixel array as claimed in claim 8, further comprising forming a plurality of pixel electrodes on the second insulation layer, wherein each of the pixel electrodes is electrically connected to one of the drain patterns through one of the openings respectively.

10. The method of fabricating the pixel array as claimed in claim 9, wherein each of the pixel electrodes overlaps one of the scan lines.

11. The method of fabricating the pixel array as claimed in claim 9, wherein a process of forming the pixel electrodes comprises a screen printing process or a spray printing process.

12. The method of fabricating the pixel array as claimed in claim 1, wherein a process of forming each of the drain patterns comprises forming the each of the drain patterns comprising a body portion and a drain connected to the body portion, and the body portion does not overlap the scan lines.

13. The method for fabricating a pixel array as claimed in claim 1, wherein a material of the oxide semiconductor layer comprises zinc oxide, indium gallium zinc oxide, or indium zinc tin oxide.

14. The method for fabricating a pixel array as claimed in claim 1, wherein a material of the oxide semiconductor layer further comprises a dopant selected from indium, aluminum, gallium, tin, or a combination of the above.

15. The method of fabricating the pixel array as claimed in claim 1, wherein a material of the substrate comprises plastic material or metal.

* * * * *